(12) United States Patent
Kagan (10) Patent No.: US 9,885,739 B2
(45) Date of Patent: Feb. 6, 2018

(54) INTELLIGENT ELECTRONIC DEVICE CAPABLE OF OPERATING AS A USB MASTER DEVICE AND A USB SLAVE DEVICE

(75) Inventor: Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 1175 days.

(21) Appl. No.: 12/628,636

(22) Filed: Dec. 1, 2009

(65) Prior Publication Data

US 2010/0076616 A1    Mar. 25, 2010

(51) Int. Cl.
    *G01R 19/25*    (2006.01)
    *G06F 1/26*     (2006.01)
    *G06F 13/10*    (2006.01)
    *G01R 21/133*   (2006.01)

(52) U.S. Cl.
    CPC ....... *G01R 19/2513* (2013.01); *G01R 21/133* (2013.01); *G06F 1/263* (2013.01); *G06F 13/102* (2013.01)

(58) Field of Classification Search
    CPC ......... G06Q 50/06; G06F 1/26–1/3296; G06F 13/00–13/4295
    See application file for complete search history.

(56) References Cited

U.S. PATENT DOCUMENTS

| | | |
|---|---|---|
| D56,045 S | 8/1920 | D'orsay |
| D76,149 S | 2/1924 | Olsen |
| 1,705,301 A | 3/1929 | Miller |
| D187,740 S | 4/1960 | Littlejohn |
| D199,808 S | 12/1964 | Gazzman, III |
| D201,100 S | 5/1965 | Little et al. |
| D241,006 S | 8/1976 | Wallace |
| 3,989,334 A | 11/1976 | Fortino |
| D273,574 S | 4/1984 | Overs |
| 4,609,247 A | 9/1986 | Annoot |
| 5,014,213 A | 5/1991 | Edwards et al. |
| D332,923 S | 2/1993 | Polydoris et al. |

(Continued)

FOREIGN PATENT DOCUMENTS

JP    07-235881    5/1995

OTHER PUBLICATIONS

IEEE Standard Common Format for Transient Data Exchange, Oct. 15, 1999, IEEE.*

(Continued)

*Primary Examiner* — Nicholas Simonetti
(74) *Attorney, Agent, or Firm* — Gerald E. Hespos; Michael J. Porco; Matthew T. Hespos (57) ABSTRACT

An intelligent electronic device (IED), e.g., an electrical power meter, having at least one removable memory device for storing data sensed and generated by the intelligent electronic device is provided. The IED includes a housing; at least one sensor; at least one analog-to-digital converter; at least one processing unit coupled to the at least one analog-to-digital converter configured to receive the digital data and store the digital data in a removable memory; and at least one device controller coupled to the at least one processing unit, the at least one device controller including an interface disposed on the housing for interfacing with the removable memory, wherein the at least one device controller is operative as a USB master or USB slave device controller.

57 Claims, 5 Drawing Sheets

(56) References Cited

U.S. PATENT DOCUMENTS

| | | |
|---|---|---|
| D343,786 S | 2/1994 | Hines et al. |
| D348,019 S | 6/1994 | Kocol et al. |
| 5,459,850 A | 10/1995 | Clay et al. |
| 5,475,693 A | 12/1995 | Christopherson et al. |
| D366,434 S | 1/1996 | Brown, III et al. |
| 5,485,595 A | 1/1996 | Assar et al. |
| 5,581,470 A | 12/1996 | Pawloski |
| 5,598,370 A | 1/1997 | Niijima et al. |
| 5,634,050 A | 5/1997 | Krueger et al. |
| 5,640,529 A | 6/1997 | Hasbun |
| 5,650,936 A | 7/1997 | Loucks et al. |
| 5,736,847 A | 4/1998 | Van Doorn et al. |
| 5,787,445 A | 7/1998 | Daberko |
| 5,828,576 A | 10/1998 | Loucks et al. |
| 5,841,269 A * | 11/1998 | Schoonmaker ......... G06F 1/305 323/276 |
| 5,897,661 A * | 4/1999 | Baranovsky et al. ........ 711/170 |
| 5,995,911 A | 11/1999 | Hart |
| 6,000,034 A | 12/1999 | Lightbody et al. |
| 6,007,353 A | 12/1999 | Webster |
| D427,533 S | 7/2000 | Cowan et al. |
| D429,655 S | 8/2000 | Cowan et al. |
| D435,471 S | 12/2000 | Simbeck et al. |
| 6,183,274 B1 | 2/2001 | Allum |
| 6,185,508 B1 | 2/2001 | Van Doorn et al. |
| 6,186,842 B1 | 2/2001 | Hirschbold et al. |
| D439,535 S | 3/2001 | Cowan et al. |
| 6,236,949 B1 | 5/2001 | Hart |
| D443,541 S | 6/2001 | Hancock et al. |
| 6,256,762 B1 | 7/2001 | Beppu |
| D455,066 S | 4/2002 | Kolinen |
| 6,384,946 B1 * | 5/2002 | Pitsch et al. .................. 398/158 |
| 6,397,155 B1 | 5/2002 | Przydatek et al. |
| D458,863 S | 6/2002 | Harding et al. |
| D459,259 S | 6/2002 | Harding et al. |
| 6,466,434 B1 * | 10/2002 | Tsai .................. G06F 1/184 360/99.18 |
| 6,476,595 B1 | 11/2002 | Heuell et al. |
| 6,476,729 B1 | 11/2002 | Liu |
| 6,493,644 B1 | 12/2002 | Jonker et al. |
| 6,513,091 B1 * | 1/2003 | Blackmon et al. ........... 710/316 |
| 6,563,697 B1 | 5/2003 | Simbeck et al. |
| 6,611,773 B2 | 8/2003 | Przydatek et al. |
| 6,611,922 B2 | 8/2003 | Ozcetin et al. |
| 6,615,147 B1 | 9/2003 | Jonker et al. |
| 6,636,030 B1 | 10/2003 | Rose et al. |
| 6,654,842 B1 * | 11/2003 | Park ............................. 710/302 |
| 6,671,635 B1 | 12/2003 | Forth et al. |
| 6,671,654 B1 | 12/2003 | Forth et al. |
| 6,687,627 B1 | 2/2004 | Gunn et al. |
| 6,694,270 B2 | 2/2004 | Hart |
| 6,735,535 B1 | 5/2004 | Kagan et al. |
| 6,737,855 B2 | 5/2004 | Huber et al. |
| 6,745,138 B2 | 6/2004 | Przydatek et al. |
| 6,751,562 B1 | 6/2004 | Blackett et al. |
| 6,751,563 B2 | 6/2004 | Spanier et al. |
| 6,792,337 B2 | 9/2004 | Blackett et al. |
| 6,792,364 B2 | 9/2004 | Jonker et al. |
| 6,798,190 B2 | 9/2004 | Harding et al. |
| 6,798,191 B1 | 9/2004 | Macfarlane et al. |
| 6,813,571 B2 | 11/2004 | Lightbody et al. |
| 6,825,776 B2 | 11/2004 | Lightbody et al. |
| 6,853,978 B2 | 2/2005 | Forth et al. |
| 6,871,150 B2 | 3/2005 | Huber et al. |
| D505,087 S | 5/2005 | Ricci et al. |
| 6,944,555 B2 | 9/2005 | Blackett et al. |
| 6,957,158 B1 | 10/2005 | Hancock et al. |
| 6,961,641 B1 | 11/2005 | Forth et al. |
| 6,983,211 B2 | 1/2006 | Macfarlene et al. |
| 6,988,025 B2 | 1/2006 | Ransom et al. |
| 6,988,182 B2 | 1/2006 | Teachman et al. |
| 6,990,395 B2 | 1/2006 | Ransom et al. |
| 7,006,934 B2 | 2/2006 | Jonker et al. |
| 7,010,438 B2 | 3/2006 | Hancock et al. |
| 7,072,779 B2 | 7/2006 | Hancock et al. |
| D525,893 S | 8/2006 | Kagan et al. |
| D526,920 S | 8/2006 | Kagan et al. |
| 7,085,824 B2 | 8/2006 | Forth et al. |
| 7,089,089 B2 | 8/2006 | Cumming et al. |
| 7,096,316 B1 | 8/2006 | Karr et al. |
| 7,127,328 B2 | 10/2006 | Ransom |
| D532,747 S | 11/2006 | Ricci et al. |
| 7,136,384 B1 | 11/2006 | Wang |
| D534,120 S | 12/2006 | Ricci et al. |
| 7,155,350 B2 | 12/2006 | Kagan |
| 7,158,050 B2 | 1/2007 | Lightbody et al. |
| 7,174,258 B2 | 2/2007 | Hart |
| 7,174,261 B2 | 2/2007 | Gunn et al. |
| 7,184,904 B2 | 2/2007 | Kagan |
| 7,188,003 B2 | 3/2007 | Ransom et al. |
| 7,191,076 B2 | 3/2007 | Huber et al. |
| 7,216,043 B2 | 5/2007 | Ransom et al. |
| D545,181 S | 6/2007 | Kagan et al. |
| 7,246,014 B2 | 7/2007 | Forth et al. |
| 7,248,977 B2 | 7/2007 | Hart |
| 7,248,978 B2 | 7/2007 | Ransom |
| 7,249,265 B2 | 7/2007 | Von Carolsfeld et al. |
| 7,256,709 B2 | 8/2007 | Kagan |
| 7,271,996 B2 | 9/2007 | Kagan et al. |
| 7,294,997 B2 | 11/2007 | Kagan |
| 7,304,586 B2 | 12/2007 | Wang et al. |
| 7,305,310 B2 | 12/2007 | Slota et al. |
| 7,337,081 B1 | 2/2008 | Kagan |
| 7,417,419 B2 | 8/2008 | Tate |
| 7,472,138 B2 | 12/2008 | Adkins et al. |
| D615,895 S | 5/2010 | Beattie |
| 7,868,782 B2 | 1/2011 | Ehrke et al. |
| D642,083 S | 7/2011 | Blanc et al. |
| D653,572 S | 2/2012 | Ohtani et al. |
| 8,176,174 B2 | 5/2012 | Kagan |
| D666,933 S | 9/2012 | Hoffman et al. |
| 8,310,403 B2 | 11/2012 | Nahar |
| 8,325,057 B2 | 12/2012 | Salter |
| 8,365,960 B1 | 2/2013 | Kalaouze |
| D682,720 S | 5/2013 | Kagan et al. |
| D682,721 S | 5/2013 | Kagan et al. |
| 8,587,949 B2 | 11/2013 | Banhegyesi et al. |
| D712,289 S | 9/2014 | Kagan et al. |
| D712,290 S | 9/2014 | Kagan et al. |
| D712,291 S | 9/2014 | Kagan et al. |
| 8,947,246 B2 | 2/2015 | Aiken |
| 9,063,181 B2 | 6/2015 | Banker |
| D739,283 S | 9/2015 | Kagan |
| 2001/0027500 A1 * | 10/2001 | Matsunaga ................... 710/104 |
| 2002/0051466 A1 | 5/2002 | Bruckman |
| 2002/0114326 A1 | 8/2002 | Mahalingaiah |
| 2002/0162014 A1 * | 10/2002 | Przydatek et al. ............ 713/200 |
| 2002/0165677 A1 | 11/2002 | Lightbody et al. |
| 2002/0166022 A1 | 11/2002 | Suzuki |
| 2002/0188814 A1 | 12/2002 | Saito et al. |
| 2003/0003908 A1 | 1/2003 | McGrew et al. |
| 2003/0014200 A1 | 1/2003 | Jonker et al. |
| 2003/0065459 A1 | 4/2003 | Huber et al. |
| 2003/0066311 A1 | 4/2003 | Li et al. |
| 2003/0101008 A1 | 5/2003 | Hart |
| 2003/0105608 A1 | 6/2003 | Hart |
| 2003/0132742 A1 | 7/2003 | Harding et al. |
| 2003/0154471 A1 | 8/2003 | Teachman et al. |
| 2003/0175025 A1 * | 9/2003 | Watanabe et al. ............ 396/155 |
| 2003/0210699 A1 | 11/2003 | Holt et al. |
| 2003/0212512 A1 | 11/2003 | Hart |
| 2003/0220752 A1 | 11/2003 | Hart |
| 2004/0028041 A1 | 2/2004 | Yasue |
| 2004/0066311 A1 | 4/2004 | Giles et al. |
| 2004/0138786 A1 * | 7/2004 | Blackett et al. .............. 700/295 |
| 2004/0138787 A1 | 7/2004 | Ransom et al. |
| 2004/0138835 A1 | 7/2004 | Ransom et al. |
| 2004/0172207 A1 | 9/2004 | Hancock et al. |
| 2004/0183522 A1 | 9/2004 | Gunn et al. |
| 2004/0193329 A1 * | 9/2004 | Ransom et al. .............. 700/286 |
| 2004/0229578 A1 | 11/2004 | Lightbody et al. |
| 2005/0017874 A1 | 1/2005 | Lightbody et al. |
| 2005/0027464 A1 | 2/2005 | Jonker et al. |
| 2005/0071106 A1 | 3/2005 | Huber et al. |

(56) References Cited

U.S. PATENT DOCUMENTS

| | | |
|---|---|---|
| 2005/0273281 A1* | 12/2005 | Wall et al. .................. 702/60 |
| 2005/0275397 A1 | 12/2005 | Lightbody et al. |
| 2005/0281105 A1 | 12/2005 | Oshima |
| 2005/0288876 A1 | 12/2005 | Doig et al. |
| 2005/0288877 A1 | 12/2005 | Doig et al. |
| 2006/0039196 A1 | 2/2006 | Gorobets et al. |
| 2006/0052958 A1 | 3/2006 | Hancock et al. |
| 2006/0070416 A1* | 4/2006 | Teratani .................. 70/389 |
| 2006/0071813 A1 | 4/2006 | Kagan |
| 2006/0077999 A1 | 4/2006 | Kagan et al. |
| 2006/0086893 A1 | 4/2006 | Spanier et al. |
| 2006/0106972 A1 | 5/2006 | Gorobets et al. |
| 2006/0133454 A1* | 6/2006 | Beckwith .................. 375/140 |
| 2006/0161400 A1 | 7/2006 | Kagan |
| 2006/0170409 A1 | 8/2006 | Kagan et al. |
| 2006/0230394 A1 | 10/2006 | Forth et al. |
| 2006/0271244 A1 | 11/2006 | Cumming et al. |
| 2007/0055889 A1* | 3/2007 | Henneberry et al. ......... 713/186 |
| 2007/0067119 A1* | 3/2007 | Loewen et al. .............. 702/57 |
| 2007/0067121 A1 | 3/2007 | Przydatek et al. |
| 2007/0114054 A1 | 5/2007 | LeMon |
| 2007/0136010 A1 | 6/2007 | Gunn et al. |
| 2007/0150214 A1 | 6/2007 | Qin et al. |
| 2007/0165365 A1 | 7/2007 | Kamiya |
| 2008/0046205 A1 | 2/2008 | Gilbert et al. |
| 2008/0065335 A1 | 3/2008 | Doig et al. |
| 2008/0263245 A1* | 10/2008 | Hsieh ....................... 710/106 |
| 2009/0011738 A1* | 1/2009 | Sasakura ............. G06F 21/6218 455/410 |
| 2009/0182921 A1* | 7/2009 | Lin et al. .................. 710/110 |
| 2010/0289457 A1* | 11/2010 | Onnerud et al. ............. 320/162 |
| 2012/0314354 A1 | 12/2012 | Rayner |
| 2013/0297840 A1 | 11/2013 | Kagan et al. |

OTHER PUBLICATIONS

Power Quality Standards Coordinating Committee, IEEE P1159.3/D9 Draft: Recommended Practice for the Transfer of Power Quality Data, Aug. 1, 2002, IEEE Standards Activities Department.*

Anderson, D., USB System Architecture, Nov. 2000, Addison-Wesley Professional, 9th Printing, pp. 22-23.*

The Authoritative Dictionary of IEEE Standards Terms, Seventh Edition, IEEE Std 100-2000 , Published 2000, p. 574.*

Xu Hong, Wang Jianhua, "An Extendable Data Engine based on OPC Specification"; Computer Standards & Interfaces 26 (2004) 515-525; Dec. 5, 2003.

BE1-951 Multifunction Protection System, Basler Electric, Sep. 2012 pp. 1-12.

Powerlogic ION8650, Schneider Electric, 2011, pp. 1-12.

Jemstar High Accuracy Revenue Meter for Generation, Transmission, and Industrial Power Measurement, Ametek Power Instruments, 2012, pp. 1-2.

Jemstar Retrofit for Generation, Transmission, and Industrial Power Measurement, Ametek Power Instruments, 2007, pp. 1-2.

Mark-V EMS60 Intelligent Energy Meter, Advanced High-Accuracy Meter With Integrated Data Telemetry Solutions and Power Quality Monitoring, Transdata Energy Metering and Automation, 2010, pp. 1-2.

Nexus 1262/1272 High Performance Utility Billing Meters With Communication & Advanced Power Quality, Electro Industries/Gaugetech, 062112 pp. 1-12.

Nexus 1262/1272 Switchboard Meter Quick Start, Electro Industries-Gaugetech, 083112, pp. 1-4.

* cited by examiner

```
Time of Use Report for Device: 0123456789ABCDEF   Serial Number:
5000000000000014
Prepared on:   , October 29, 2009 at 14:48:57
Group:    , Frozen
Averaging:   , Block Window
From:   , 10/01/2009 00:00:00.09 ,  To   , 10/01/2009 23:59:59.00
R1: On-Peak
Register Accumulations
Quadrant 1 + 4 Watthour , 000000000 k
Quadrant 1      VAhour , 00.0000000 M
Quadrant 1      VARhour , 00.0000000 M
Quadrant 4      VAhour , 00.0000000 M
Quadrant 4      VARhour , 00.0000000 M
Quadrant 2 + 3 Watthour , 000000000 k
Quadrant 2      VAhour , 00.0000000 M
Quadrant 2      VARhour , 00.0000000 M
Quadrant 3      VAhour , 00.0000000 M
Quadrant 3      VARhour , 00.0000000 M
Demand   ,  , Time Stamp
Quadrant 1 + 4 Watt , 0.00 , 10/01/2009 00:00:00.11
Quadrant 2 + 3 Watt , 0.00 , 10/01/2009 00:00:00.11
Quadrant 1 + 2 VAR , 0.00 , 10/01/2009 00:00:00.11
Quadrant 3 + 4 VAR , 0.00 , 10/01/2009 00:00:00.11
Quadrant 1 + 4 Coincident VAR , 0.00 ,
Quadrant 2 + 3 Coincident VAR , 0.00 , R2: Off-Peak
Register Accumulations
Quadrant 1 + 4 Watthour , 000000000 k
Quadrant 1      VAhour , 00.0000000 M
Quadrant 1      VARhour , 00.0000000 M
Quadrant 4      VAhour , 00.0000000 M
Quadrant 4      VARhour , 00.0000000 M
Quadrant 2 + 3 Watthour , 000000000 k
Quadrant 2      VAhour , 00.0000000 M
Quadrant 2      VARhour , 00.0000000 M
Quadrant 3      VAhour , 00.0000000 M
Quadrant 3      VARhour , 00.0000000 M
Demand   ,  , Time Stamp
Quadrant 1 + 4 Watt , 0.00 , 10/01/2009 00:00:00.11
Quadrant 2 + 3 Watt , 0.00 , 10/01/2009 00:00:00.11
Quadrant 1 + 2 VAR , 0.00 , 10/01/2009 00:00:00.11
Quadrant 3 + 4 VAR , 0.00 , 10/01/2009 00:00:00.11
Quadrant 1 + 4 Coincident VAR , 0.00 ,
Quadrant 2 + 3 Coincident VAR , 0.00 ,
```

INTELLIGENT ELECTRONIC DEVICE CAPABLE OF OPERATING AS A USB MASTER DEVICE AND A USB SLAVE DEVICE

BACKGROUND

1. Field

The present disclosure relates generally to intelligent electronic devices (IEDs) for electrical power systems, and more particularly, to an IED including a removable device for storing data relating to electrical power distribution systems.

2. Description of the Related Art

Electric utility companies ("utilities") track electric usage by customers by using power meters. These meters track the amount of power consumed at a particular location. These locations range from power substations, to commercial businesses, to residential homes. The electric utility companies use information obtained from the power meter to charge their customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., at a substation. These power and energy meters are installed in substations to provide a visual display of real-time data and to alarm when problems occur. These problems include limit alarms, breaker control, outages and many other types of events.

In today's times, users are interested in capturing data in an intelligent electronic device (IED) and taking that data back to an office and analyzing or databasing the data at a later time. The common way to gather data in the art now is to download stored data via a communication port to a laptop or a stationary computing device utilizing a serial or Ethernet protocol. The disadvantage of this technology is that the user doesn't always have a laptop available and there is a latency time to gathering the data due to the protocol communication. For instance, to download 2 megabytes of data using traditional serial download schemes could take as long as 10 minutes.

Therefore, a need exists for devices, systems and methods for storing data sensed and generated by an intelligent electronic device (IED), e.g., a power meter, and for managing the stored data to extend the useful life of the meter.

SUMMARY

An intelligent electronic device (IED), e.g., an electrical power meter, having at least one removable memory device for storing data sensed and generated by the intelligent electronic device is provided. Utilizing the techniques of the present disclosure, a user will be able to just remove the portable or removable memory device and replace it with a fresh one and then download the data from the removable memory device to a computing device at a later period. In one embodiment, the IED will utilize a USB (Universal Serial Bus) architecture for communicating generated data to the removable memory device.

In one aspect of the present disclosure, an IED is configured to operate as a USB master and/or USB slave device. The USB master configuration for the IED can be implemented using both hardware and software both internally to the host IED processor or by an additional processor or processors or other type of silicon coupled to the IED processor either directly or indirectly. Moreover, the USB interface may also be allowed to be used as a USB slave wherein under user control or wherein the IED itself via its processor or other components stored internally can determine whether it chooses to be a USB master or USB slave device.

According to one aspect of the present disclosure, an intelligent electronic device (IED) is provided including a housing; at least one sensor configured for sensing at least one electrical parameter distributed to a load; at least one analog-to-digital converter coupled to the at least one sensor and configured for converting an analog signal output from the at least one sensor to a digital data; at least one processing unit coupled to the at least one analog-to-digital converter configured to receive the digital data and store the digital data in a removable memory; and at least one device controller coupled to the at least one processing unit, the at least one device controller including at least one interface disposed on the housing for interfacing with the removable memory, wherein the at least one device controller is operative as a master or slave device controller.

In one aspect, the at least one device controller operates in accordance with a Universal Serial Bus (USB) specification.

In a further aspect, the at least one device controller is electrically isolated from the at least one processing unit.

In another aspect, the IED further includes a switch for setting the at least one device controller in a master mode or a slave mode.

In yet another aspect, the at least one interface is self-configurable to master and/or slave or is configured by a user.

In a further aspect, the IED further includes a security device for preventing tampering with the removable memory.

In still another aspect, the removable memory stores data for a user to retrieve at least one of historical trending, waveform samples, or meter diagnostic data, wherein the data stored in the removable memory is in comma separated value format, a Comtrade format, a PQDIF format, binary format, etc.

According to another aspect of the present disclosure, an intelligent electronic device is provided including a housing; at least one sensor configured for sensing at least one electrical parameter distributed to a load; at least one analog-to-digital converter coupled to the at least one sensor and configured for converting an analog signal output from the at least one sensor to a digital data; at least one processing unit coupled to the at least one analog-to-digital converter configured to receive the digital data and process the digital data; a USB master device controller coupled to the at least one processing unit, the USB master device controller including a first USB interface disposed on the housing for interfacing with a first external device; and a USB slave device controller coupled to the at least one processing unit, the USB slave device controller including a second USB interface disposed on the housing for interfacing with a second external device.

According to a further aspect of the present disclosure, an intelligent electronic device is provided including a housing; at least one sensor configured for sensing at least one electrical parameter distributed to a load; at least one analog-to-digital converter coupled to the at least one sensor and configured for converting an analog signal output from the at least one sensor to a digital data; at least one processing unit coupled to the at least one analog-to-digital converter configured to receive the digital data, process the digital data and store the digital data in a removable memory; a display disposed on the housing for displaying the sensed and processed data; at least one device controller coupled to the at least one processing unit; and an interface disposed on the housing for interfacing with the removable memory; wherein the at least one device controller is operative as a master or slave device controller.

In one aspect, the interface is self-configurable to master and/or slave or configured by a user to master and/or slave.

In another aspect, the interface is wireless.

In a further aspect, the at least one device controller is selected to operate as a slave device controller, further comprising an input device coupled to the interface to navigate the display, wherein the input device is a mouse, a joystick, a keyboard, etc.

According to another aspect of the present disclosure, the at least one device controller is selected to operate as a slave device controller, and the IED further includes a hub coupled to the interface, the hub enabling coupling of 127 external slave devices to the intelligent electronic device.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering.

Figure 1:
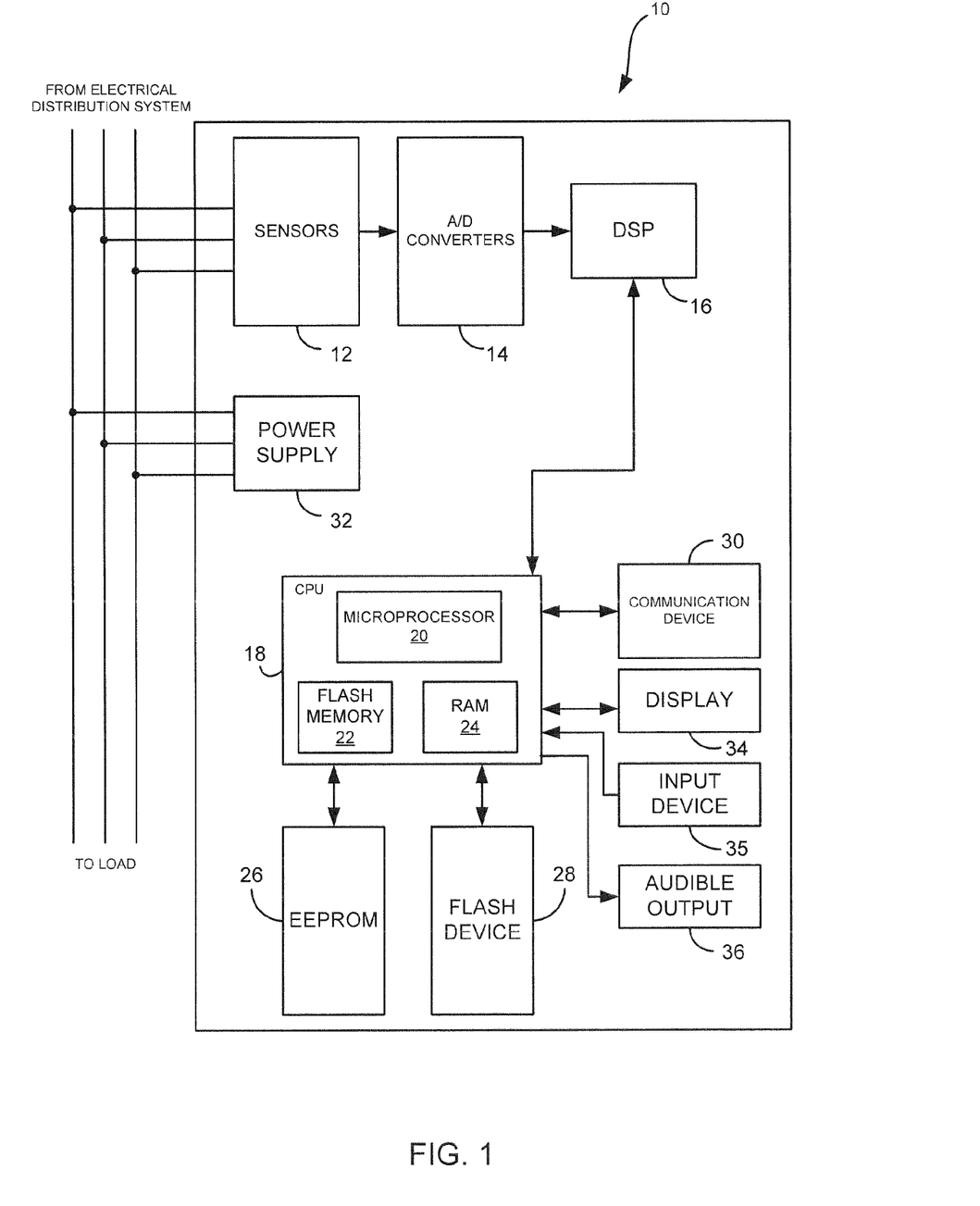
FIG. 1 is a diagram of an intelligent electronic device in accordance with an embodiment of the present disclosure.

An intelligent electronic device (IED) 10 for monitoring and determining an amount of electrical power usage by a consumer and for providing audible and visual indications to a user is illustrated in FIG. 1. Generally, the IED 10 includes sensors 12, a plurality of analog-to-digital (A/D) converters 14 and a processing system including a central processing unit (CPU) 18 and/or a digital signal processor (DSP) 16. The sensors 12 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 18 or DSP 16.

The CPU 18 is configured for receiving the digital signals from the A/D converters 14 to perform the necessary calculations to determine the power usage and controlling the overall operations of the IED 10. In a preferred embodiment, the DSP 16 will receive the digital signals from the A/D converters 14 and perform the necessary calculations to determine the power usage to free the resources of the CPU 18. The CPU 18 will include a microprocessor 20 executing instructions and performing various calculations, flash memory 22 for storing executable instructions and permanent data tables for controlling the overall operation of the microprocessor and random access memory (RAM) 24 for holding data during computations by the microprocessor 20.

A first memory 26 is coupled to CPU 18 and stores calibration and setup parameters of the IED 10, e.g., meter configuration, serial number of the device, etc. Memory 26 may be an integrated circuit in the form of a FLASH or EEPROM, or any other known or to be developed type of memory which is nonvolatile, capable of being changed in the IED, and amenable to making such changes difficult for an end user.

The IED 10 further includes a second memory 28 for storing sensed and generated data for further processing and for retrieval, e.g., data logs. Memory 28 may be flash memory and may be removable or non-removable. In one embodiment, data stored on memory 28 may be retrieved by an external device or computer via a communication device 30. In another embodiment, where memory 28 is removable, memory 28 will be in the form of a memory card such as a CompactFlash card, a Memory Stick, a SmartMedia card, etc., and data stored therein will be retrieved from an appropriate memory card reader.

A power supply 32 is also provided for providing power to each component of the IED 10. In one embodiment, the power supply 32 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 32, e.g., from a different electrical circuit, an uninterruptible power supply (UPS), etc.

The IED 10 of the present disclosure will have a user interface for interacting with a user and for communicating events, alarms and instructions to the user. The user interface will include a display 34 for providing visual indications to the user. The display 34 may include a touch screen, a liquid crystal display (LCD), a plurality of LED number segments, individual light bulbs or any combination of these. The display 34 may provide the information to the user in the form of alpha-numeric lines, computer-generated graphics, videos, etc. The user interface will include an input device 35 for entering data, e.g., parameters, limits, etc. The input device may include pushbuttons, a keypad, a touch screen, at least one dial, etc. The user interface may also include a speaker or audible output means 36 for audibly producing instructions, alarms, data, etc. The speaker 36 will be coupled to the CPU 18 via a digital-to-analog converter (D/A) for converting digital audio files stored in memory to analog signals playable by the speaker 36.

The IED 10 will include the communication device 30 for enabling data communications between the IED 10 and other computing devices, e.g., a desktop computer, laptop computer, other IEDs, etc. The communication device 34 may be a modem, network interface card (NIC), wireless transceiver, etc. As described above, the IED 10 may be coupled to a personal computer over a network, e.g., a LAN, WAN, the Internet, etc., via the communication device 30, where the personal computer will retrieve data, e.g., logs, from the IED 10. The communication device 30 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data. It is to be appreciated that the network may be a local area network (LAN), wide area network (WAN), the Internet or any known network that couples a plurality of computers to enable various modes of communication via network messages. Furthermore, the IED 10 will communicate using the various known protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc.

It is to be understood that the present disclosure may be implemented in various forms of hardware, software, firmware, special purpose processors, or a combination thereof. The IED may also include an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

As the IED 10 collects data and processes the collected data, the data will be stored on, for example, flash memory 28. The data may be stored in various types of logs, e.g., a historical trend log which is a collection of time-stamped records used to track any parameter over time. Other exemplary logs may include limit logs, event-triggered waveforms logs (e.g., records a waveform when a user-programmable value goes out of limit and when the value returns to normal), power quality logs (e.g., records magnitude and duration of voltage and current surges and sags for every power quality event), status change (input) logs, control output (relay) logs, system event logs, flicker logs and reset logs. However, flash devices "wear out" after a large but finite number of erases. Furthermore, the IED 10 may determine and store meter diagnostic data. This can become an issue if the same place in the flash memory is used over and over again.

Flash devices are partitioned into sectors and impose the rule that all bytes in a sector must be erased at the same time. Thus, for managing the number of erases, the sector is the basic unit. The IED 10 of the present disclosure manages sector wear by placing data in the flash memory 28 so that the number of erases in all sectors is equalized over time. The IED 10 uses the flash memory for its logs. This technique is appropriate for any similar application in which memory contents change over time and in which there is slightly more capacity in the flash memory than is actually needed. The extra capacity is used to ensure that free sectors are always available when needed.

In one embodiment, the memory for storing the data and/or logs is configured as removable memory. The IED of this embodiment facilitates replacing or swapping out the memory if the memory is "worn" or about to go bad. In one embodiment, the IED will utilize a USB (Universal Serial Bus) architecture for communicating generated data to the removable memory.

Figure 2A:
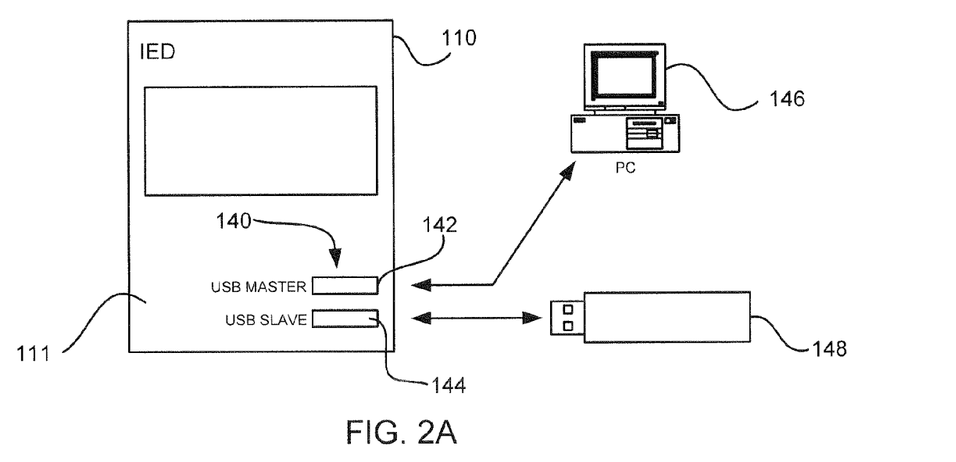
FIG. 2A is a diagram of an intelligent electronic device utilizing a USB (Universal Serial Bus) architecture in accordance with an embodiment of the present disclosure.

Referring to FIG. 2A, an IED 110 utilizing a USB architecture in accordance with the present disclosure is Illustrated. The IED 110 shown in FIG. 2A includes a USB interface 140 disposed on an external surface of a housing 111 of the IED 110. The USB interface 140 includes a USB master port 142 and a USB slave port 144. The USB master port 142 will allow a USB master device, e.g., PC 146, to access the internal memory of the IED 110. When a USB master device is coupled to the IED 110 via port 142, the IED 110 will respond as a USB slave device. Furthermore, the IED 110 acts a USB master device when a slave device, e.g., removable storage device 148, is coupled to the USB slave port 144.

One of the common issues with USB design is that since the connections are electrical and not optical connections, they run a danger to the user when connected to a high power source, e.g., an electrical power distribution system. Because of this danger, there will need to be a large amount of isolation between the USB connector and the electrical voltage input. One elegant and innovative way of providing isolation is to connect the USB connector port to the front panel of the housing and then utilize the power coming from the USB reading device, i.e., master device, and not from the meter or IED to power the connector and the USB electronics.

Figure 2B:
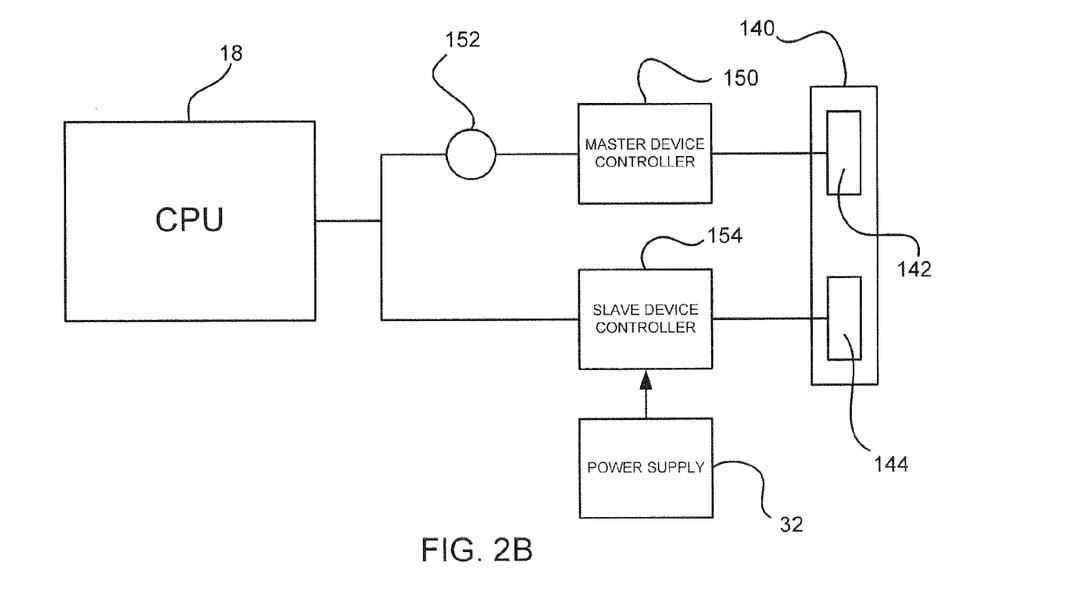
FIG. 2B is a schematic diagram of the USB architecture employed in the IED shown in FIG. 2A.

Referring to FIG. 2B, a schematic diagram of a USB architecture in accordance with one embodiment of the present disclosure is illustrated. USB master port 142 is coupled to a master device controller 150. The master device controller 150 may be any known programmable device operating in accordance with one of the various known USB specifications and may include one or more drivers for various master devices. It is envisioned that the master device controller could be a separate hardware chip or processing module or could be embedded directly into the host CPU 18 as hardware, software or a combination thereof.

At least one optoisolator 152 is then coupled from the secondary of the USB chip 150 to the at least one host or intermediary processor 18 of the IED. This allows for very high electrical isolation and very low cost eliminating the needs of isolation transformers, a multiple tap power supply or DC to DC isolating power supplies. When a master device is coupled to the USB master port 142, the master device such as a lap top computer, smart phone or other intelligent device is providing power to the USB master device controller 150.

USB slave port 144 is coupled to a slave device controller 154. The slave device controller 154 may be any known programmable device operating in accordance with one of the various known USB specifications and may include one or more drivers for various slave devices. The slave device controller 154 is coupled to the at least one host or intermediary processor 18 of the IED without the use of an optoisolator. Since the slave device, e.g., a memory stick, in most cases will not have a power source, a power source internal to the IED will be utilized to power the slave device controller 154 and the slave device coupled to USB slave port 144. In one embodiment, power supply 32 will be coupled to the slave device controller 154. It is to be appreciated that at least one intermediary device may be used to coupled power supply 32 to the slave device controller 154 to step down or condition the power being provided. It is envisioned that the slave device controller 154 could also be separate hardware or a separate processing module or could be embedded into the host CPU 18 as hardware, software or a combination thereof.

It is envisioned by the teachings of the present disclosure that the USB master and USB slave connections depicted in FIG. 2A could also share the same physical USB connector, as will be described below. In this mode, the device or IED can auto-detect or a user could configure the port to act as a master or a slave port. All other embodiments are contemplated by the present disclosure such as for non-limiting example wireless USB or other similar architectures using embedded serial protocol.

Figure 3A:
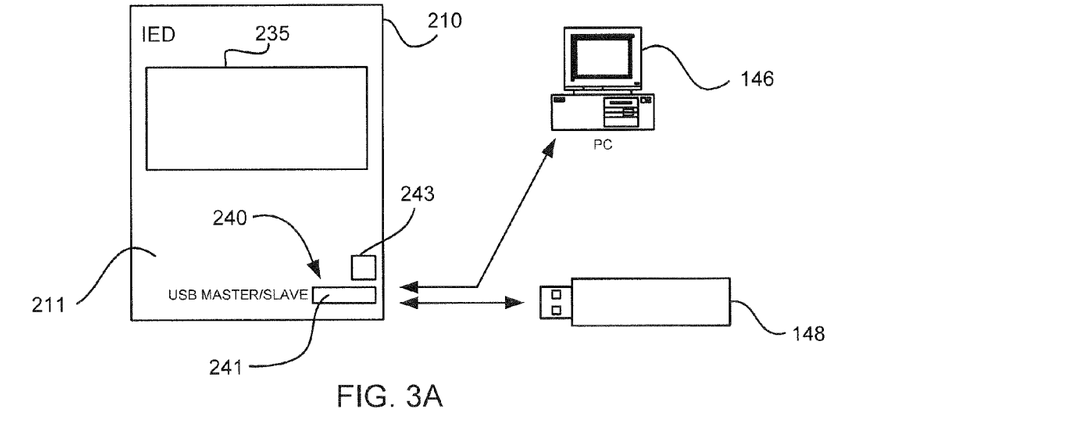
FIG. 3A is a diagram of an intelligent electronic device utilizing a USB architecture in accordance with another embodiment of the present disclosure.

In another embodiment, the IED 210 includes a USB interface 240 that has only one port 241 as shown in FIG. 3A. In this embodiment, port 241 may be utilized by a master device, e.g., PC 146, or a slave device, i.e., storage device 148. A switching mechanism is provided to change modes of the port 241 from a USB master to USB slave port. The switching mechanism could be physical or virtual utilizing software commands to change the port configuration. An exemplary virtual switching technique for an electrical panel meter is disclosed in commonly owned U.S. Pat. No. 7,313,489 to Kagan, the contents of which are incorporated by reference in their entirety. The port may also self configure itself by utilizing software algorithms or hardware schemes such as signal change detection or other type of software algorithm all of which are contemplated in the present disclosure.

Figure 3B:
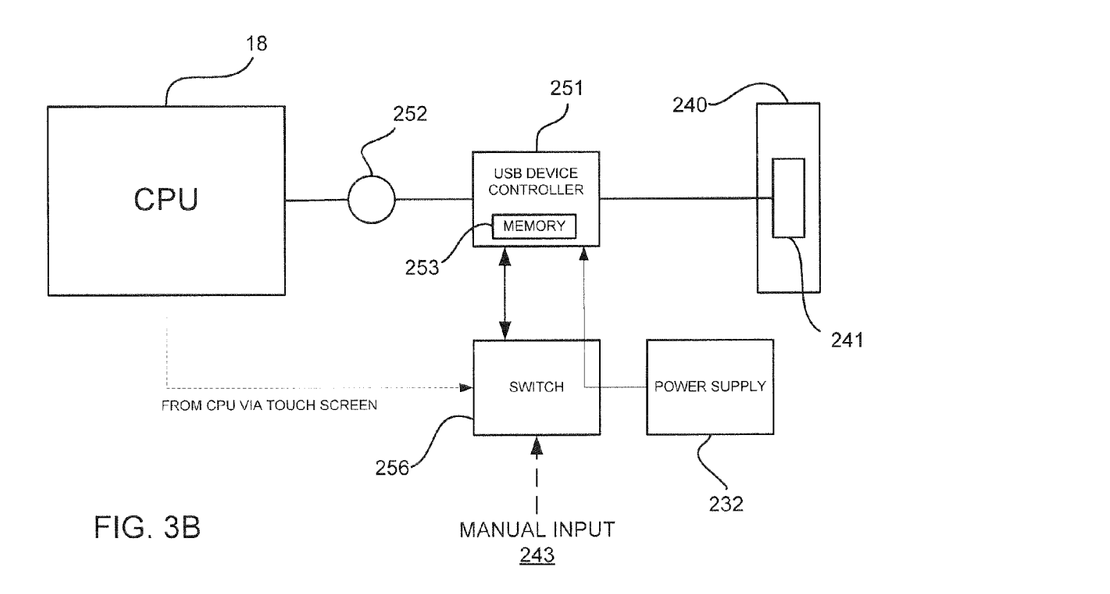
FIG. 3B is a schematic diagram of the USB architecture employed in the IED shown in FIG. 3A.

Referring to FIG. 3B, a schematic diagram for the USB architecture employed in the IED shown in FIG. 3A is illustrated. In this embodiment, the port 241 is disposed on an external surface of housing 211 and is coupled to a single device controller 251. At least one optoisolator 252 is coupled from the secondary of the USB chip 251 to the at least one host or intermediary processor 18 of the IED. The device controller 251 is capable of operating in a master mode or slave mode upon loading of an appropriate driver. It is to be appreciated that device controller 251, in certain embodiments, will have on-board memory 253 for storing, among others, at least one master driver and at least one slave driver. In other embodiments, the master/slave drivers may be stored in other memory, e.g., flash memory 22, and, upon determining the proper mode, the CPU 18 will retrieve the appropriate driver and load it into the device controller 251. In further embodiments, the appropriate driver will be transmitted to the device controller 251 from the external device being coupled to port 241.

The mode of the device controller 251 will be determined based on the type of device coupled to port 241. If a master device, e.g., PC 146, is coupled to the port 241, the device controller 251 will need to operate in a master mode. In one embodiment, switch 256 will transmit a control signal to the device controller 251 to change its mode. The switch 256 will operate either based on a manual input via a button or the like 243 mounted on the IED adjacent to the port 241 or the switch will receive a signal from the CPU 18 in the case where an operator changes the mode via a touch screen 235. When the device controller 251 is placed in the master mode, that is, a USB master device is coupled to port 241 and the IED 210 is operating as a USB slave, switch 256 sends a master control signal to the device controller 251 and removes the power supply 232 from the circuit. In the master mode of the device controller 251, the device controller 251 will receive power via the port 241 from the master device, e.g., a laptop computer. When the device controller 251 is placed in the slave mode, that is, a USB slave device is coupled to port 241 and the IED 210 is operating as a USB master, switch 256 sends a slave control signal to the device controller 251 and switches in the power supply 232 to the circuit. In the slave mode of the device controller 251, the device controller 251 will receive power via the power supply 232 and provide power to the slave device, e.g., a removable memory device.

It is to be appreciated that the mode of the device controller 251 could be switched automatically without a manual input from an operator. For example, the device controller 251 will auto-detect if the connected device is a master or slave device. For example, once the device controller 251 determines that something is connected to port 241, the device controller will wait a predetermined period of time to see if a command or message is received. If no command or message is received, the connected device is most likely a slave device since slave device do not send commands or messages and the device controller 251 will send an appropriate control signal to switch 256. Alternatively, if the device controller 251 receives a command or message from the connected device, the device controller 251 will send the appropriate signal to the switch 256 to remove power.

In utilizing the hardware device(s) described herein, the user will be able to accomplish the various applications of the disclosure which are described below.

Utilizing a USB memory stick, the IED of the present disclosure will be a USB master. As a USB master, the IED uses the USB memory stick as a storage medium. The USB master could treat the stick as a USB hard drive or a form of IDE interface. This being the case, the IED will be programmed to control the USB memory stick for placing data and/or files on to the memory stick. The IED will perform this function by sensing the electrical parameters of the electrical power distribution system, processing the data collected from the sensors 12 and analog-to-digital converters 14 and then storing the raw or modified or computed results from such sensing to the USB "drive". The IED will also utilize a real time clock or other type of time sensing algorithm to store with data a time stamp. This will allow a user to have timed analysis of events on the line of the electrical power distribution system.

Utilizing this technique, the user will be able to ascertain historical profiling such as by non-limiting example 15 minute watt and VARs distribution, energy over a month and many other applications. Additionally, the IED can be configured to sense or received data from sensors or be coupled to external sensors whether directly or indirectly to sense non-electrical parameters such as ambient temperature, gas pressure, greenhouse emissions or other such parameters. This data can be stored with the time stamp in the USB drive for additional later analysis.

Figure 4:
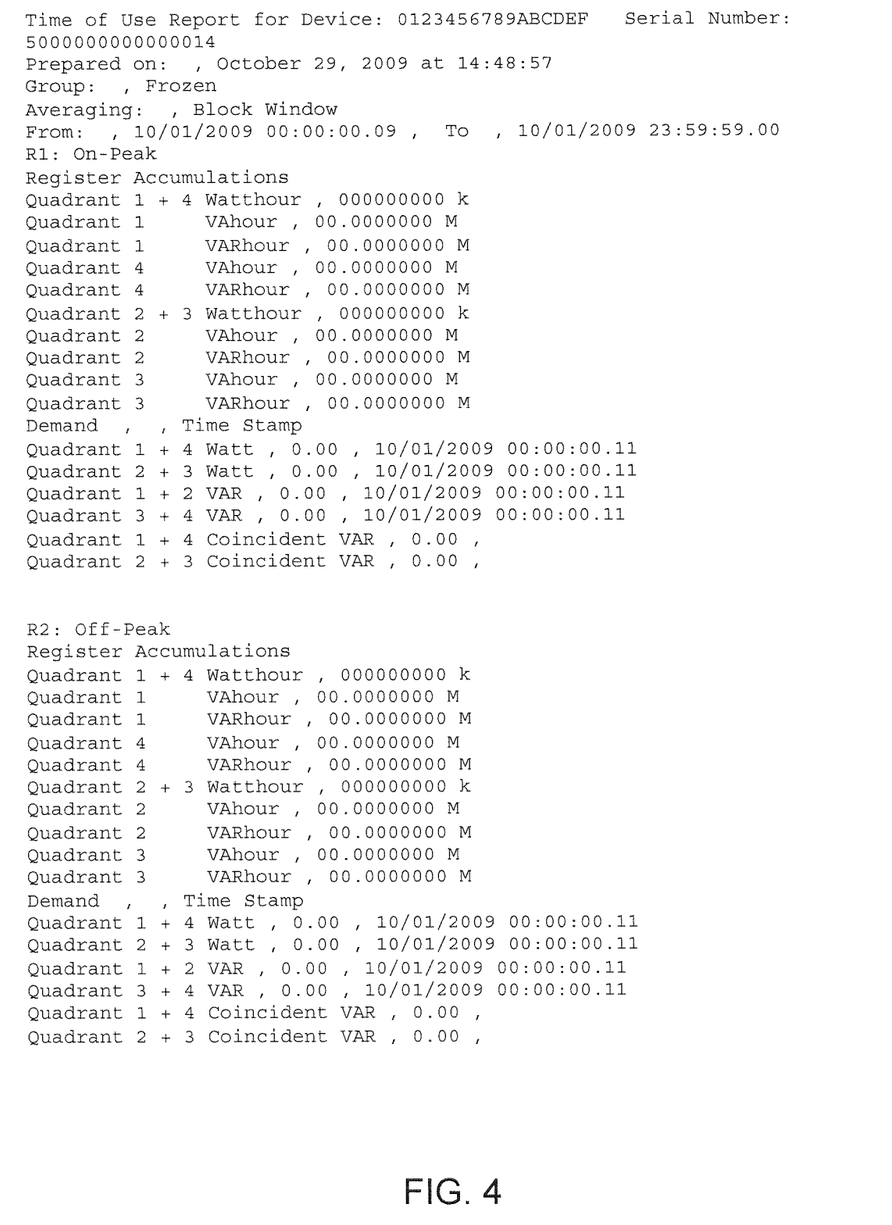
FIG. 4 is exemplary data in CSV format generated by an IED in accordance with an embodiment of the present disclosure.

In one embodiment, the IED stores the data in a comma separated value (CSV) format, as shown in FIG. 4, so that the data can be easily imported into standard data analysis software such as spreadsheets, databases, etc. The format will normally include data and/or the time/date stamp related to that data or some form of time/date encoding so that a software package will be able to ascertain the time and/or date for when the data was captured and/or stored.

Other non-limiting embodiments include that data can be stored in a binary or ASCII format so that either a computer could read or process the data in a recognizable format. Such storage of data could include the Electric Power Research Institute PQDIF format, Comtrade format and/or ANSI C12.19 protocol data. Other protocols and file formats are contemplated by the present disclosure. The above are only for illustrative examples.

Furthermore, the USB memory stick, i.e., USB slave device, could also be used to store a shadow copy of the internal system memory or be used as a debug device for the IED to ascertain if it is working properly. This USB memory stick or device could be used by the IED to store debug codes, failures codes or provide a log of executable information that the internal IED processor is using.

When the IED is operating as a USB slave, the IED to be able to download stored data from internal meter storage and is treated like a "serial" port wherein the a computing device can establish a communication stream with the meter by serial master/slave communication such as but not limited to Modbus and DNP 3.0 type protocols or PPP, TCP/IP or other such communication protocols. The USB "slave" could also allow data to be sent to and from the IED utilizing file transferring methods such as FTP or other such file transferring protocol.

Other forms of data retrieval anticipated by the present disclosure would be to use removable serial flash such as SD flash manufactured by SanDisk Corporation of Milpitas, Calif. (an exemplary flash is commercially available as model number SDSDRH-032G-A11) or parallel flash such as but not limited to NOR flash and Compact Flash, an example of which is manufactured by SanDisk Corporation as model number SDCFX-032G-A61. This technology will enable use similar to the USB type device and as such is contemplated by the present disclosure.

Different mounting forms are envisioned by the present disclosure. One preferable form would be to mount the USB port in the front panel of the device. This allows a user to access either the USB port to remove and install new USB media, e.g., a storage device. The USB media can be mounted on the front panel of the device anywhere accessible to a meter once install in an electrical switchgear panel. Other mounting options would include mounting the USB storage device in the rear of the instrument behind the electrical switchgear providing some security from unauthorized removal.

Figure 5A:
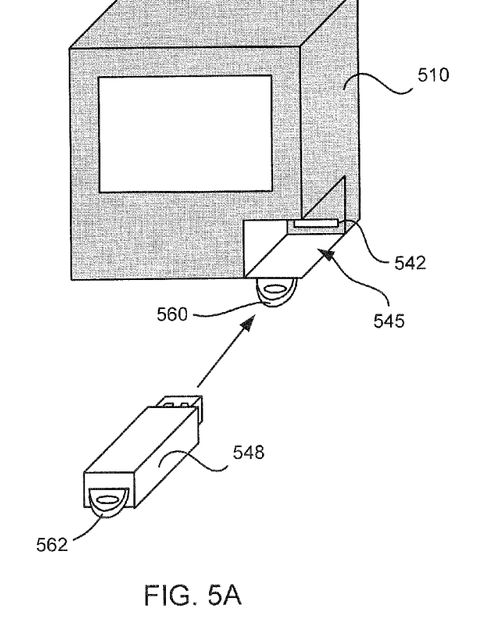
FIGS. 5A-5C illustrate an IED utilizing a USB memory device in accordance with an embodiment of the present disclosure.
Figure 5B:
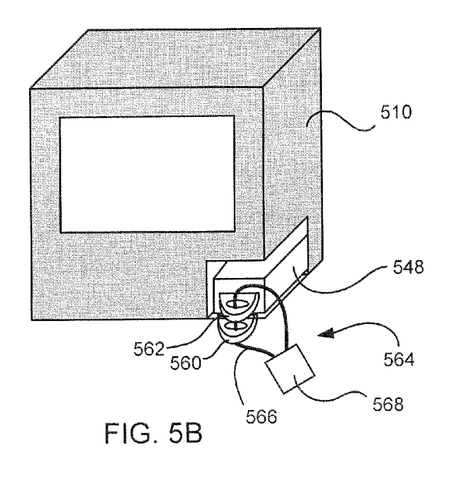

In one embodiment, the USB interface 542 is disposed in a recess 545 of the housing of the IED 510 as illustrated in FIG. 5A. In this embodiment, the recess 545 is configured to fully accept the USB memory stick 548 to protect the USB memory stick or device from damage. In certain embodiments, both the housing of the IED 510 and the USB memory stick 548 include corresponding ring members 560, 562 respectfully. As shown in FIG. 5B, when the USB memory stick is fully disposed in the recess 545, the corresponding ring members 560 and 562 align so a security device 564 can be applied therethrough, e.g., a wire 566 and seal 568, to prevent unauthorized removal of the USB device 548 and to indicate tampering.

Figure 5C:
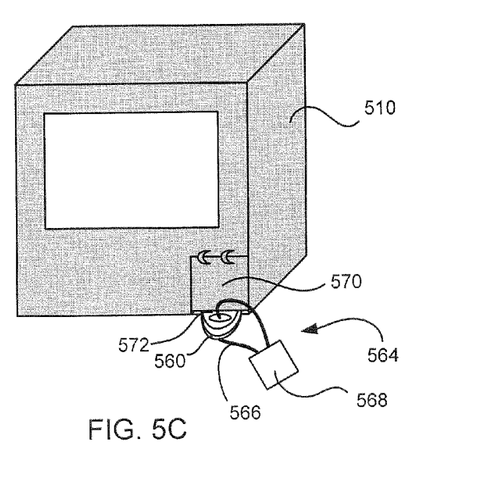

It is also envisioned that mounting could be within a door 570 on the instrument or IED 510 providing an enclosed structure for the USB or similar type memory as illustrated in FIG. 5C. The door 570 for the memory could then be sealed utilizing a type of lock or seal, e.g., wire 566 and seal 568. In this embodiment, ring member 560 remains coupled to the housing of the IED 510 and ring member 572 is coupled to the door 570. There are many mechanical methods of placing and/or securing the memory to the meter 510, whether internal or external with or without a door and these methods are envisioned by the present disclosure.

It is to be appreciated that the IED may communicate to devices other than a storage device. For example, when the IED is in a master mode, the IED may be coupled to a USB slave device(s) such as: a printer for printing data measured or calculated by the IED; an input device, e.g., a mouse, joystick, keyboard, etc., for navigating the display 34; a image capture device, e.g., a webcam, to capture images of the environment surrounding the IED; and a communication device (e.g., a modem, a wireless transceiver, a network interface card, etc.) for enabling the IED to transmit or forward its data to other IEDs, computing devices, servers, etc. It is to be appreciated this listing of USB slave devices is merely illustrative and not exhaustive of the possible devices that could be coupled to the IED.

In one embodiment, the IED is configured or selected to be the USB master device and can connect up to 127 slaves devices via at least one USB hub. In this embodiment, the USB master device, will go through an enumeration process, either on power up or when devices are connected via a USB bus, and assign each connected slave device an address. The IED as the USB master device will query each device to find out what type of data transfer the specific device wants to perform, for example, interrupt mode, bulk transfer mode or isochronous mode. The IED as the USB master device can also send commands or query parameters with control packets. The Universal Serial Bus divides the available bandwidth into frames with the USB master IED device keeping track of the total bandwidth that the slave devices are requesting and controls the frames to ensure the slaves devices get the bandwidth they need.

It is to be appreciated that the teachings, and devices, of the present disclosure are compatible with any known or to be developed USB standard, for example, USB 1.0, 2.0 and 3.0 (also known as SuperSpeed USB) including any preceding and intermediate versions. Furthermore, the architectures disclosed herein support the following signaling or transmission rates: a low speed rate of 1.5 Mbits/s as defined by USB 1.0; a full speed rate of 12 Mbits/s as defined by USB 1.1; a hi-speed rate of 480 Mbits/s as defined by USB 2.0; and a SuperSpeed rate of 5.0 Gbits/s as defined by USB 3.0. Other signaling or transmission rates are also contemplated. Regardless of the specific standard employed, the IED of the present disclosure is forward and backward compatible to communicate to any existing or to be developed external device.

Furthermore, it is to be appreciated that the disclosed interfaces or ports, e.g., interfaces 140, 240 and ports 142, 144, 241, include any known or to be developed USB connector, e.g., a plug or receptacle, such as a type A connector, a type B connector, Mini-A connector, Mini-B connector, Micro-A connector, Micro-B connector, Micro-AB connector, etc. Additionally, the interfaces and ports may include proprietary connectors such as the UltraPort employed by IBM, 10P10C connectors employed by American Power Conversion, HTC ExtUSB employed by HTC Corporation, the Port-Port connector employed by Nokia, among others.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '________' is hereby defined to mean . . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An intelligent electronic device comprising:
   a meter housing configured to be mounted on an electrical switchgear panel, the meter housing including at least a front panel;
   at least one sensor configured for sensing at least one electrical parameter distributed to a load;

at least one analog-to-digital converter coupled to the at least one sensor and configured for converting an analog signal output from the at least one sensor to digital data;

at least one processing unit coupled to the at least one analog-to-digital converter, the at least one processing unit configured to receive the digital data;

at least one device controller coupled to the at least one processing unit, the at least one device controller including a first Universal Serial Bus (USB) external device interface disposed on the front panel of the meter housing, the first USB external device interface configured for removably interfacing with a first external device that is external to the meter housing;

memory configured for storing a master driver and a slave driver, the master driver enabling the at least one device controller to operate in a master mode and the slave driver enabling the at least one device controller to operate in a slave mode;

a power supply for supplying power to the at least one device controller; and a switch external from the at least on device controller, the switch transmits a signal to the at least one device controller that switches the at least one device controller to the master mode and disconnect the power supply from the at least one device controller, the switch further transmits a second signal to the at least one device controller that switches the at least one device controller to the slave mode and connects the power supply to the at least one device controller;

wherein the at least one processing unit is configured to retrieve the master driver from the memory and load the master driver into the at least one device controller to operate the at least one device controller in the master mode;

wherein the at least one processing unit is configured to retrieve the slave driver from the memory and load the slave driver into the at least one device controller to operate the at least one device controller in the slave mode;

wherein the at least one device controller enables the intelligent electronic device to act as a slave device when the at least one device controller is in the master mode and the at least one device controller enables the intelligent electronic device to act as a master device when the at least one device controller is in the slave mode.

2. The intelligent electronic device of claim 1, wherein the at least one device controller is electrically isolated from the at least one processing unit by an optoisolator.

3. The intelligent electronic device of claim 1, wherein the first USB external device interface is located behind a door within the meter housing.

4. The intelligent electronic device of claim 3, wherein the door further includes a security device for preventing tampering.

5. The intelligent electronic device of claim 1, further comprising a security device for preventing tampering with the first USB external device interface.

6. The intelligent electronic device of claim 1, further comprising a removable memory coupled to the first USB interface that stores at least one of historical trending data, waveform sample data, and meter diagnostic data.

7. The intelligent electronic device of claim 6, wherein the data stored in the removable memory is in comma separated value format.

8. The intelligent electronic device of claim 6, wherein the data stored in the removable memory is in a Comtrade format.

9. The intelligent electronic device of claim 6, wherein the data stored in the removable memory is in a PQDIF format.

10. The intelligent electronic device of claim 6, wherein the data stored in the removable memory is in binary format.

11. The intelligent electronic device of claim 1, wherein, when the first external device is connected to the first USB external device interface, the power supply is disabled and power is received from the first external device.

12. The intelligent electronic device of claim 1, wherein the first external device is a generally rectangular memory stick and the meter housing further includes a recess configured to fully accept the memory stick.

13. The intelligent electronic device of claim 12, wherein the recess includes a door to prevent tampering of the memory stick.

14. The intelligent electronic device of claim 1, further comprising:
a display for displaying the sensed and processed data; and
an input device coupled to the first USB external device interface to navigate the display.

15. The intelligent electronic device of claim 14, wherein the input device is one of a mouse, a joystick, and a keyboard.

16. The intelligent electronic device of claim 1, further comprising a hub coupled to the first USB external device interface, the hub enabling coupling of 127 external slave devices to the intelligent electronic device.

17. The intelligent electronic device of claim 1, wherein the switch changes modes of the at least one device controller based on an input received from an input device disposed on the housing.

18. The intelligent electronic device of claim 1, wherein the switch changes modes of the at least one device controller based on an input signal received from the at least one processor.

19. The intelligent electronic device of claim 1, wherein the switch changes modes of the at least one device controller based on an input signal received from the at least one device controller.

20. The intelligent electronic device of claim 19, wherein the at least one device controller generates the input signal that is transmitted to the switch based on the first external device coupled to the first USB external device interface.

21. The intelligent electronic device of claim 20, wherein the at least one device controller determines the type of first external device via a signal change detection scheme.

22. The intelligent electronic device of claim 1, further comprising a user interface including:
a display that displays at least one of sensed and processed data; and at least one input device that inputs data.

23. An intelligent electronic device comprising:
a meter housing;
at least one sensor disposed in the meter housing and coupled to an electrical power distribution system, the at least one sensor configured for sensing at least one electrical parameter distributed to a load;
at least one analog-to-digital converter disposed in the meter housing and coupled to the at least one sensor and configured for converting an analog signal output from the at least one sensor to digital data;
at least one processing unit disposed in the meter housing and coupled to the at least one analog-to-digital converter, the at least one processing unit configured to receive the digital data and process the digital data;

a Universal Serial Bus (USB) device controller disposed in the meter housing and coupled to the at least one processing unit, the USB device controller including a USB interface disposed on a surface of the meter housing for removably interfacing with a first external device that is external to the meter housing, the USB device controller operating as a master device controller or a slave device controller based on a type of the first external device coupled to the USB interface;

a memory disposed in the meter housing and configured for storing a master driver and a slave driver, the master driver enabling the USB device controller to operate as a master device controller and the slave driver enabling the USB device controller to operate as a slave device controller;

and a switch disposed in the meter housing external from the USB device controller, the switch transmits a signal to the USB device controller that switches the USB device controller to operate as a master device controller, the switch further transmits a second signal to the USB device controller that switches the USB device controller to operate as a slave device controller.

24. The intelligent electronic device of claim 23, wherein the USB device controller is electrically isolated from the at least one processing unit by an optoisolator.

25. The intelligent electronic device of claim 23, wherein the first external device is a computing device.

26. The intelligent electronic device of claim 23, wherein the first external device is a memory device.

27. The intelligent electronic device of claim 22, wherein, when the first external device is connected to the USB interface, the power supply is disabled and power is received from the first external device.

28. The intelligent electronic device of claim 23, wherein the switch changes modes of the USB device controller based on an input received from an input device disposed on the housing.

29. The intelligent electronic device of claim 23, wherein the switch changes modes of the USB device controller based on an input signal received from the at least one processing unit.

30. The intelligent electronic device of claim 23, wherein the switch changes modes of the USB device controller based on an input signal received from the USB device controller.

31. The intelligent electronic device of claim 30, wherein the USB device controller generates the input signal that is transmitted to the switch based on the first external device interfaced to the USB interface.

32. The intelligent electronic device of claim 31, wherein the USB device controller determines the type of first external device via a signal change detection scheme.

33. The intelligent electronic device of claim 23, further comprising a user interface including:

a display that displays at least one of sensed and processed data; and at least one input device that inputs data.

34. The intelligent electronic device of claim 23, wherein the first external device is a generally rectangular memory stick and the meter housing further includes a recess configured to fully accept the memory stick.

35. The intelligent electronic device of claim 34, wherein the recess includes a door to prevent tampering of the memory stick.

36. The intelligent electronic device of claim 23, wherein the USB interface is located behind a door within the meter housing.

37. The intelligent electronic device of claim 36, wherein the door further includes a security device for preventing tampering.

38. The intelligent electronic device of claim 23, further comprising a security device for preventing tampering with the USB interface.

39. An intelligent electronic device comprising:

a meter housing configured to be mounted to an electrical switchgear panel, the meter housing including at least a front panel device;

at least one sensor configured for sensing at least one electrical parameter distributed to a load;

at least one analog-to-digital converter coupled to the at least one sensor and configured for converting an analog signal output from the at least one sensor to digital data;

at least one processing unit coupled to the at least one analog-to-digital converter, the at least one processing unit configured to receive the digital data and process the digital data;

a display disposed on the front panel device of the meter housing for displaying the sensed and processed data;

a device controller coupled to the at least one processing unit;

a power supply for supplying power to the device controller; and a switch external from the device controller, the switch transmits a signal that switches the device controller to a master mode and disconnects the power supply from the device controller to operate the intelligent electronic device as a slave device and the switch transmits a second signal that switches the device controller to a slave mode and connects the power supply to the device controller to operate the intelligent electronic device as a master device;

wherein the device controller includes a first Universal Serial Bus (USB) external device interface disposed on the front panel device of the meter housing for removably interfacing with an external device that is external to the meter housing.

40. The intelligent electronic device of claim 39, further comprising an optoisolator configured for electrically isolating the device controller from the at least one processing unit.

41. The intelligent electronic device of claim 39, wherein the external device is a removable memory, and wherein at least one of the digital data and processed digital data is stored in the removable memory and includes at least one of historical trending, waveform samples, and meter diagnostic data retrievable by a user.

42. The intelligent electronic device of claim 41, wherein at least one of the digital data and processed digital data stored in the removable memory includes a format selected from at least one of a comma separated value format, a Comtrade format, a PQDIF format, and a binary format.

43. The intelligent electronic device of claim 39, wherein the first USB external device interface includes a wireless interface.

44. The intelligent electronic device of claim 39, wherein the first USB external device interface includes both a slave interface and a master interface.

45. The intelligent electronic device of claim 39, further comprising a door attached to the meter housing, the door configured to shield the removable memory and a second USB external device interface.

46. The intelligent electronic device of claim 45, wherein the door further includes a security device for preventing tampering with the removable memory.

47. The intelligent electronic device of claim 39, further comprising a hub enabling coupling of 127 external slave devices to the intelligent electronic device.

48. The intelligent electronic device of claim 39, wherein the switch changes modes of the device controller based on an input received from an input device disposed on the housing.

49. The intelligent electronic device of claim 39, wherein the switch changes modes of the device controller based on an input signal received from the at least one processing unit.

50. The intelligent electronic device of claim 39, wherein the switch changes modes of the device controller based on an input signal received from the device controller.

51. The intelligent electronic device of claim 50, wherein the device controller generates the input signal that is transmitted to the switch based on the external device interfaced to the USB external device interface.

52. The intelligent electronic device of claim 51, wherein the device controller determines the type of external device via a signal change detection scheme.

53. The intelligent electronic device of claim 39, wherein the external device is a generally rectangular memory stick and the meter housing further includes a recess configured to fully accept the memory stick.

54. The intelligent electronic device of claim 53, wherein the recess includes a door to prevent tampering of the memory stick.

55. The intelligent electronic device of claim 39, wherein the USB external device interface is located behind a door within the meter housing.

56. The intelligent electronic device of claim 55, wherein the door further includes a security device for preventing tampering.

57. The intelligent electronic device of claim 39, further comprising a security device for preventing tampering with the USB external device interface.

* * * * *